(12) United States Patent
Skogen et al.

(10) Patent No.: US 7,995,877 B1
(45) Date of Patent: Aug. 9, 2011

(54) OPTICAL NAND GATE

(75) Inventors: Erik J. Skogen, Albuquerque, NM (US); James Raring, Goleta, CA (US); Anna Tauke-Pedretti, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 343 days.

(21) Appl. No.: 12/182,683

(22) Filed: Jul. 30, 2008

(51) Int. Cl.
*G02B 6/12* (2006.01)
(52) U.S. Cl. .......................................... 385/14
(58) Field of Classification Search ...................... 385/14
See application file for complete search history.

(56) References Cited

U.S. PATENT DOCUMENTS

| | | | |
|---|---|---|---|
| 5,297,068 A * | 3/1994 | Guilfoyle et al. | 708/191 |
| 5,451,767 A * | 9/1995 | Amano et al. | 250/214.1 |
| 2003/0007719 A1* | 1/2003 | Forrest et al. | 385/14 |

OTHER PUBLICATIONS

S. Kodama et al, "2.3 picoseconds optical gate monolithically integrating photodiode and electroabsorption modulator", Electronics Letters, vol. 37, No. 19, Sep. 13, 2001, pp. 1185-1186.
S. Kodama et al, "500 Gbit/s optical gate monolithically integrating photodiode and electroabsorption modulator", Electronics Letters, vol. 40, No. 9, Apr. 29, 2004, pp. 555-556.
David A. B. Miller et al, "The Quantum Well Self-Electrooptic Effect Device: Optoelectronic Bistability and Oscillation, and Self-Linearized Modulation," IEEE Journal of Quantum Electronics, vol. QE-21, No. 9 Sep. 1985, pp. 1462-1476.
James W. Raring et al, "Design and Demonstration of Novel QW Intermixing Scheme for the Integration of UTC-Type Photodiodes with QW-Based Components", IEEE Journal of Quantum Electronics, Feb. 2006, vol. 42, No. 2, pp. 171-181.
James W. Raring et al, "40-Gb/s Widely Tunable Transceivers", IEEE Journal of Selected Topics in Quantum Electronics, vol. 13, No. 1, Jan.-Feb. 2007, pp. 3-14.
Erik J. Skogen et al, "Monolithically Integrated Active Components: A Quantum-Well Intermixing Approach", IEEE Journal of Selected Topics in Quantum Electronics, vol. 11, No. 2, Mar./Apr. 2005, pp. 343-355.
Toshihide Yoshimatsu et al, "100-Gb/s Error-Free Wavelength Conversion with a Monolithic Optical Gate Integrating a Photodiode and Electroabsorption Modulator", IEEE Photonics Technology Letters, 2005, vol. 17, No. 11 pp. 2367-2369.

* cited by examiner

*Primary Examiner* — Uyen-Chau N Le
*Assistant Examiner* — Hoang Tran
(74) *Attorney, Agent, or Firm* — John P. Hohimer

(57) ABSTRACT

An optical NAND gate is formed from two pair of optical waveguide devices on a substrate, with each pair of the optical waveguide devices consisting of an electroabsorption modulator and a photodetector. One pair of the optical waveguide devices is electrically connected in parallel to operate as an optical AND gate; and the other pair of the optical waveguide devices is connected in series to operate as an optical NOT gate (i.e. an optical inverter). The optical NAND gate utilizes two digital optical inputs and a continuous light input to provide a NAND function output. The optical NAND gate can be formed from III-V compound semiconductor layers which are epitaxially deposited on a III-V compound semiconductor substrate, and operates at a wavelength in the range of 0.8-2.0 μm.

20 Claims, 12 Drawing Sheets

| "A" Input | "B" Input | Output |
|---|---|---|
| "0" | "0" | "0" |
| "0" | "1" | "0" |
| "1" | "0" | "0" |
| "1" | "1" | "1" |

| "A" Input | "B" Input | NAND Output |
|---|---|---|
| "0" | "0" | "1" |
| "0" | "1" | "1" |
| "1" | "0" | "1" |
| "1" | "1" | "0" |

US 7,995,877 B1

OPTICAL NAND GATE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to digital optical logic gates, and in particular to a optical NAND gate which utilizes electroabsorption modulators and waveguide photodetectors to generate a NAND function digital optical output from a pair of digital optical inputs.

BACKGROUND OF THE INVENTION

Optical logic gates have been the subject of research for several decades due to the possibility of achieving higher operating speeds than logic based on electronics. The advantages of digital signal processing in the optical domain include higher signal bandwidth, lower signal cross-talk, and greater protection against electronic eavesdropping. All-optical signal processing also eliminates the need to convert signals from the optical domain into the electronic domain for processing and then to re-convert the processed signals from the electronic domain back into the optical domain. This can reduce the cost, electrical power requirement, size and weight needed for optical-to-electronic converters, electronic signal processing circuitry, and electronic-to-optical converters.

The present invention addresses the need for optical logic gates by providing an optical NAND gate which can be formed as a photonic integrated circuit (PIC) with two electroabsorption modulator (EAM) photodiode (PD) pairs, with a first EAM/PD pair being electrically connected in parallel to operate as an optical AND gate, and with a second EAM/PD pair being electrically connected in series to operate as an optical NOT gate. This configuration according to the present invention provides advantages in terms of optical isolation of input and output signals, an ability to be monolithically integrated and an ability to operate using direct-current electrical power sources with a relatively low power consumption and a relatively compact size. The present invention is also advantageous in providing for optical signal gain and regeneration thereby permitting a fan out capability which can allow multiple optical NAND gates to be interconnected together to provide a higher level of logic functionality as needed for optical signal processing or optical computing.

These and other advantages of the present invention will become evident to those skilled in the art.

SUMMARY OF THE INVENTION

The present invention relates to an optical NAND gate which receives a pair of digital optical inputs each with a logic state and generates therefrom a digital optical output which is a NAND representation of the logic states of the pair of digital optical inputs. The optical NAND gate comprises a substrate; an optical AND gate formed on the substrate and comprising a first electroabsorption modulator and a first waveguide photodetector, and an optical NOT gate (i.e. an inverter) formed on the substrate and comprising a second electroabsorption modulator and a second waveguide photodetector. The first electroabsorption modulator receives a first digital optical input of the pair of digital optical inputs. The first waveguide photodetector receives a second digital optical input of the pair of digital optical inputs and generates therefrom a photocurrent signal. This photocurrent signal is connected to modulate an absorption of the first electroabsorption modulator through which the first digital optical input is transmitted and thereby convert the pair of digital optical inputs into a logical AND function output of the first electroabsorption modulator (i.e. an AND representation of the logic states of the pair of digital optical inputs).

The second waveguide photodetector receives the logical AND function output from the first electroabsorption modulator and generates therefrom another photocurrent signal. This other photocurrent signal is electrically connected to modulate the absorption of the second electroabsorption modulator which receives an input of continuous light, thereby converting the continuous light input into the digital optical output of the optical NAND gate.

The first electroabsorption modulator and the first waveguide photodetector are electrically connected together in parallel, and are electrically connected through a resistor to a bias voltage. The second electroabsorption modulator and the second waveguide photodetector are electrically connected in series.

The continuous light input can be generated by a laser which can be located on the substrate. The laser can comprise a distributed-Bragg reflector (DBR) laser. The laser can operate in the range of 0.8-2.0 microns, with the pair of digital optical inputs also being in this same wavelength range.

A plurality of optical waveguides can be provided on the substrate to guide the first digital optical input to the first electroabsorption modulator, to guide the second digital optical input to the first waveguide photodetector, to guide the continuous light input to the second electroabsorption modulator, to guide the logical AND function output to the second waveguide photodetector, and to guide the digital optical output from the second electroabsorption modulator.

The substrate can comprise a III-V compound semiconductor substrate. Each electroabsorption modulator and each waveguide photodetector can comprise a plurality of III-V compound semiconductor layers which are epitaxially grown on the III-V compound semiconductor substrate.

In certain embodiments of the present invention, the III-V compound semiconductor substrate can comprise indium phosphide (InP); and the plurality of III-V compound semiconductor layers can be selected from the group consisting of indium gallium arsenide phosphide (InGaAsP) layers, indium gallium arsenide (InGaAs) layers, indium aluminum gallium arsenide (InAlGaAs) layers, and combinations thereof. In other embodiments of the present invention, the III-V compound semiconductor substrate can comprise gallium arsenide (GaAs), and the plurality of III-V compound semiconductor layers can be selected from the group consisting of GaAs layers, aluminum gallium arsenide (AlGaAs) layers, InGaAsP layers, InGaAs layers, and combinations thereof.

The present invention further relates to an optical NAND gate which receives a first digital optical input and a second digital optical input and generates therefrom a NAND function digital optical output. The optical NAND gate comprises a III-V compound semiconductor substrate having a plurality of III-V compound semiconductor layers epitaxially grown thereon; a first electroabsorption modulator formed from the plurality of III-V compound semiconductor layers, with the first electroabsorption modulator receiving the first digital optical input; a first waveguide photodetector formed from the plurality of III-V compound semiconductor layers to receive the second digital optical input and to generate therefrom a first photocurrent signal which changes an absorption of light in the first electroabsorption modulator and thereby converts the first digital optical input into an output of the first electroabsorption modulator; a second waveguide photodetector formed from the plurality of III-V compound semiconductor layers to receive the output from the first electroabsorption modulator and to generate therefrom a second photocurrent signal; a laser formed from the plurality of III-V compound semiconductor layers to provide a source of continuous light; and a second electroabsorption modulator formed from the plurality of III-V compound semiconductor layers to receive the continuous light from the laser and to convert the continuous light into the NAND function digital optical output in response to the second photocurrent signal which is electrically connected to vary the absorption of the continuous light being transmitted through the second electroabsorption modulator. The first digital optical input and the second digital optical input can each have a wavelength in the range of 0.8-2.0 microns.

In some embodiments of the present invention, the III-V compound semiconductor substrate can comprise indium phosphide (InP); and the plurality of III-V compound semiconductor layers can be selected from the group consisting of indium gallium arsenide phosphide (InGaAsP) layers, indium gallium arsenide (InGaAs) layers, indium aluminum gallium arsenide (InAlGaAs) layers, and combinations thereof. In other embodiments of the present invention, the III-V compound semiconductor substrate can comprise gallium arsenide (GaAs); and the plurality of III-V compound semiconductor layers can be selected from the group consisting of GaAs layers, aluminum gallium arsenide (AlGaAs) layers, indium gallium arsenide phosphide (InGaAsP) layers, indium gallium arsenide (InGaAs) layers, and combinations thereof. A plurality of passive optical waveguides can be provided on the substrate and formed from the plurality of III-V compound semiconductor layers. These passive optical waveguides can be used to guide the first digital optical input to the first electroabsorption modulator, to guide the second digital optical input to the first waveguide photodetector, to guide the continuous light from the laser to the second electroabsorption modulator, to guide the output from the first electroabsorption modulator to the second waveguide photodetector, and to guide the NAND function digital optical output from the second electroabsorption modulator.

The first electroabsorption modulator and the first waveguide photodetector can be electrically connected in parallel, and can be connected through a resistor to a bias voltage. The second electroabsorption modulator and the second waveguide photodetector can be electrically connected in series, and can be connected to at least one additional bias voltage. The laser can comprise a distributed Bragg reflector (DBR) laser.

The present invention also relates to a photonic integrated circuit (PIC) which generates a NAND function digital optical output from a pair of digital optical inputs. The PIC comprises a first pair of optical waveguide devices formed on a substrate, with the first pair of optical waveguide devices comprising a first electroabsorption modulator which is electrically connected in parallel with a first photodetector, with the first electroabsorption modulator receiving a first digital optical input of the pair of digital optical inputs, and with the first photodetector receiving a second digital optical input of the pair of digital optical inputs to generate therefrom a photocurrent signal which changes a reverse-bias voltage on the first electroabsorption modulator to generate a digital optical output of the first electroabsorption modulator; and a second pair of optical waveguide devices formed on the substrate, with the second pair of optical waveguide devices comprising a second electroabsorption modulator which is electrically connected in series with a second photodetector, with the second electroabsorption modulator receiving an input of continuous light, and with the second photodetector receiving the digital optical output from the first electroabsorption modulator and generating therefrom another photocurrent signal which changes the reverse-bias voltage on the second electroabsorption modulator to modulate the continuous light being transmitted through the second electroabsorption modulator and thereby generate the NAND function digital optical output. The continuous light input can be provided by a laser located on the substrate.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIGS. 4A-4G are taken along the section line 1-1 in FIG. 1; and FIG. 4H is taken along the section line 2-2 in FIG. 1.

DETAILED DESCRIPTION OF THE INVENTION

Figure 1:
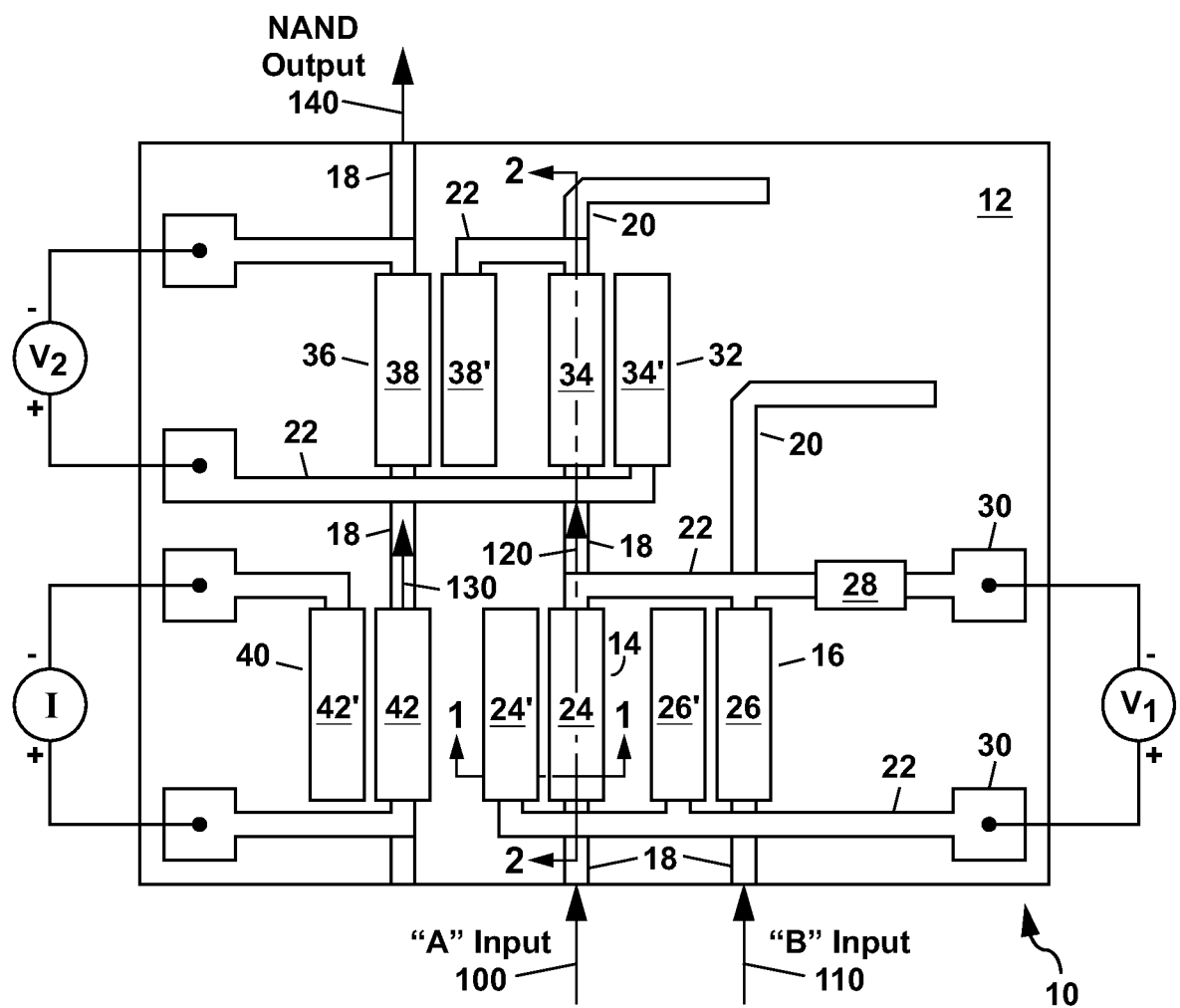
FIG. 1 shows a schematic plan view of a first example of the optical NAND gate of the present invention.

Referring to FIG. 1, there is shown a schematic plan view of a first example of the optical NAND gate 10 of the present invention which can be formed as a photonic integrated circuit (PIC). The optical NAND gate 10 comprises a substrate 12 on which are formed a first electroabsorption modulator (EAM) 14 and a first waveguide photodetector (PD) 16 which are connected to function as an optical AND logic gate (also referred to as an AND gate). Each electroabsorption modulator and waveguide photodetector described herein can be formed either as a lumped-element device, or as a traveling-wave device.

In FIG. 1, the first electroabsorption modulator 14 receives a first digital optical input 100, which is denoted as the "A" input. This "A" input 100 can be directed to the first electroabsorption modulator 14 via a passive optical waveguide 18 (also referred to herein as an optical waveguide 18). The first waveguide photodetector 16 in FIG. 1 receives a second digital optical input 110, which is denoted as the "B" input, with the "B" input 110 being directed to the first waveguide photodetector 16 using another optical waveguide 18. The "B" input 110 is absorbed within the first waveguide photodetector 16 to generate a photocurrent signal which can be used to modulate an absorption of the "A" input 100 which is transmitted through the first electroabsorption modulator 14. Since the "B" input is a digital signal, then the photocurrent signal will also generally be a digital signal depending upon a data rate for operation of the device 10. This modulation, which changes the absorption of the modulator 14 in response to a digital state of the photocurrent signal from the first waveguide photodetector 16, converts the "A" input 100 into a logical AND function output 120 of the first electroabsorption modulator 14. Any of the "B" input 110 which is not absorbed in the waveguide photodetector 16 to generate the photocurrent signal is coupled into an L-shaped passive waveguide 20 which serves as an optical trap.

The first electroabsorption modulator 14 and the first waveguide detector 16 are electrically connected in parallel by wiring 22 on the substrate 12. The wiring 22, which can be in the form of a radio-frequency (rf) transmission line, connects an upper electrode 24 of the first electroabsorption modulator 14 to an upper electrode 26 of the first waveguide detector 16. Additional wiring 22 connects a lower electrode 24' of the first electroabsorption modulator 14 to a lower electrode 26' of the first waveguide detector 16. The parallel-connected modulator 14 and photodetector 16 are further connected through a resistor 28 to a first bias voltage $V_1$ which is used to reverse bias both the modulator 14 and photodetector 16. The first bias voltage $V_1$ can be a few volts (e.g. −5 volts) and can be supplied by a direct-current (dc) power supply which can be located off of the substrate 12 and connected to the wiring 22 using a pair of bond pads 30 on the substrate 12.

Figures 2A, 2B:
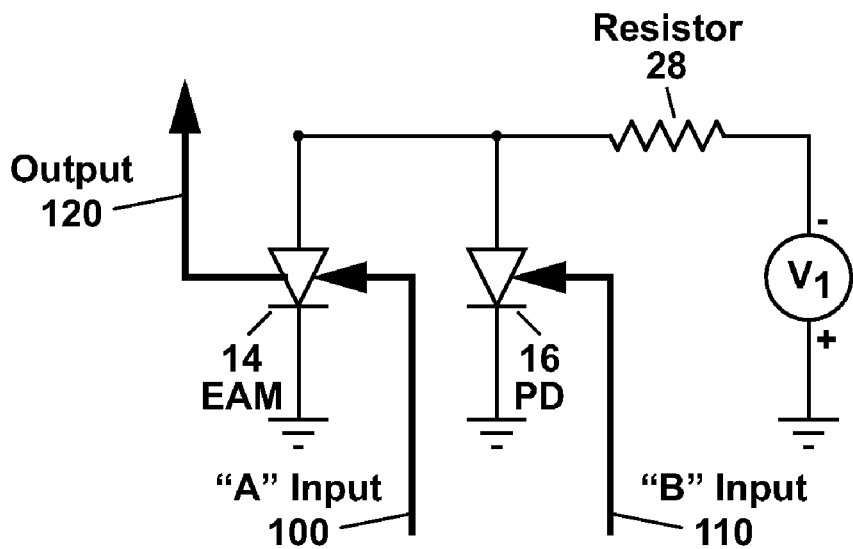
FIG. 2A shows a schematic diagram of an electrical and optical circuit of a parallel-connected first waveguide photodetector and first electroabsorption modulator from the optical NAND gate of FIG. 1.
FIG. 2B shows a logical truth table for the electrical and optical circuit of FIG. 2A which functions as an optical AND gate.

FIG. 2A shows a schematic diagram of the electrical and optical circuit which is produced by the parallel-connected modulator 14 and photodetector 16 to illustrate operation of this first pair of optical waveguide devices in the optical NAND gate 10. By design, the photocurrent signal generated by the first waveguide photodetector 16 in response to incident light (i.e. the "B" input 110) is relatively independent of an electric field produced therein by the applied reverse-bias voltage $V_1$ and depends only upon the intensity of the incident light. This is also the case for a second waveguide photodetector 32 which will be described hereinafter. On the other hand, the absorption within the first electroabsorption modulator 14 depends upon the electric field produced herein by the applied reverse-bias voltage $V_1$. Thus, as the amount of the reverse-bias voltage $V_1$ across the electroabsorption modulator 14 increases, the absorption of light therein will also increase either due to a Franz-Keldysh effect or due to a quantum-confined Stark effect. This is also the case for a second electroabsorption modulator 36 which will be described hereinafter.

In FIG. 2A, when the "B" input 110 provides a very low or nonexistent light level corresponding to a logical "0" state, no photocurrent signal will be generated within the first waveguide photodetector 16, so that no change in the reverse-bias voltage across the photodetector 16 and modulator 14 will occur. In this case, substantially the entire reverse-bias voltage $V_1$ will be applied across both the photodetector 16 and modulator 14. This relatively high reverse-bias voltage $V_1$ will result in a relatively high electric field within the electroabsorption modulator 14 to provide a high absorption of light therein so that very little, if any, of the "A" input 100 will be transmitted through the modulator 14 to form the light output 120 (also referred to herein as a logical AND function output 120, or simply as an output 120). Thus, when the "B" input is in the logical "0" state, the output 120 will also be in the logical "0" state regardless of the logical state of the "A" input.

If on the other hand, the "B" input 110 is at a relatively high light level corresponding to a logical "1" state, then the light from the "B" input 110 will be detected to generate the photocurrent signal in the first waveguide photodetector 16. This will produce an increased current flow through the resistor 30 which will reduce the amount of the reverse-bias voltage $V_1$ which is dropped across the photodetector 16 and modulator 14. The reduction in the amount of the reverse-bias voltage $V_1$ across the electroabsorption modulator 14 will reduce the electric field therein so that the absorption of the "A" input 100 in the modulator 14 will be reduced. If the "A" input 100 is in a logical "1" state, the reduced absorption will allow substantially all of the "A" input 100 to be transmitted through the modulator 14 to provide a logical "1" state for the light output 120. When the "A" input 100 corresponds to a logical "0" state, the output 120 from the modulator 14 will also be in a logical "0" state when the "B" input 110 is high (i.e. in a logical "1" state).

A logical truth table for operation of the electrical and optical circuit of FIG. 2A is shown in FIG. 2B. This portion of the optical NAND gate 10, which includes the parallel-connected modulator 14 and photodetector 16 functions as an optical AND gate, with the light output 120 being defined by ANDing the "A" input 100 and the "B" input 110.

Returning to FIG. 1, the light output 120 is guided out from the first electroabsorption modulator 14 through another passive waveguide 18 to a second waveguide photodetector 32 which includes an upper electrode 34 and a lower electrode 34'. This second waveguide photodetector 32 is electrically connected in series to a second electroabsorption modulator 36, which has an upper electrode 38 and a lower electrode 38', using wiring 22. A second bias voltage $V_2$ can be provided to reverse-bias the series-connected modulator 36 and photodetector 32. This can be done using the same or a different dc power which supplies the voltage $V_1$, with each reverse bias voltage being up to a few volts (e.g. −5 V). As shown in FIG. 1, the orientation of the upper and lower electrodes for the second waveguide photodetector 32 and the second electroabsorption modulator 36 can be reversed from that of the first waveguide photodetector 16 and the first electroabsorption modulator 14 to facilitate connecting the photodetector 32 and modulator 36 in series.

The light output 120 which enters the second waveguide photodetector 32 is absorbed therein to generate another photocurrent signal, with any of the unabsorbed light output 120 which is transmitted through the photodetector 32 being trapped by another L-shaped passive waveguide 20. The photocurrent signal generated by the second waveguide photodetector 32 is used to modulate the absorption of light in the second electroabsorption modulator 36 since the series connection of the photodetector 32 and modulator 36 requires that the same photocurrent signal flow through both of these waveguide devices 32 and 36 and this will change the amount of the reverse-bias voltage $V_2$ which is dropped across the modulator 36.

Continuous light 130 (i.e. continuous lasing emission) from a laser 40 is directed through a passive waveguide 18 to the second electroabsorption modulator 36 and is transmitted therethrough depending upon the absorption of the modulator 36. The laser 40 can be a distributed Bragg reflector (DBR) laser 40 which is located on the substrate 12 with a plurality of electrodes including an upper electrode 42 and a lower electrode 42'. The DBR laser 40 is forward-biased with a current source Ito generate the continuous light 130. The continuous light 130 from the DBR laser 40 can have an optical power in the range of 3-10 milliWatts (mW) or more. In other embodiments of the present invention, the continuous light 130 can be provided by a laser 40 which is located off the substrate 12 (see FIG. 5) and coupled into the passive waveguide 18 on the substrate 12 using either free-space or optical fiber coupling.

Figure 2C:
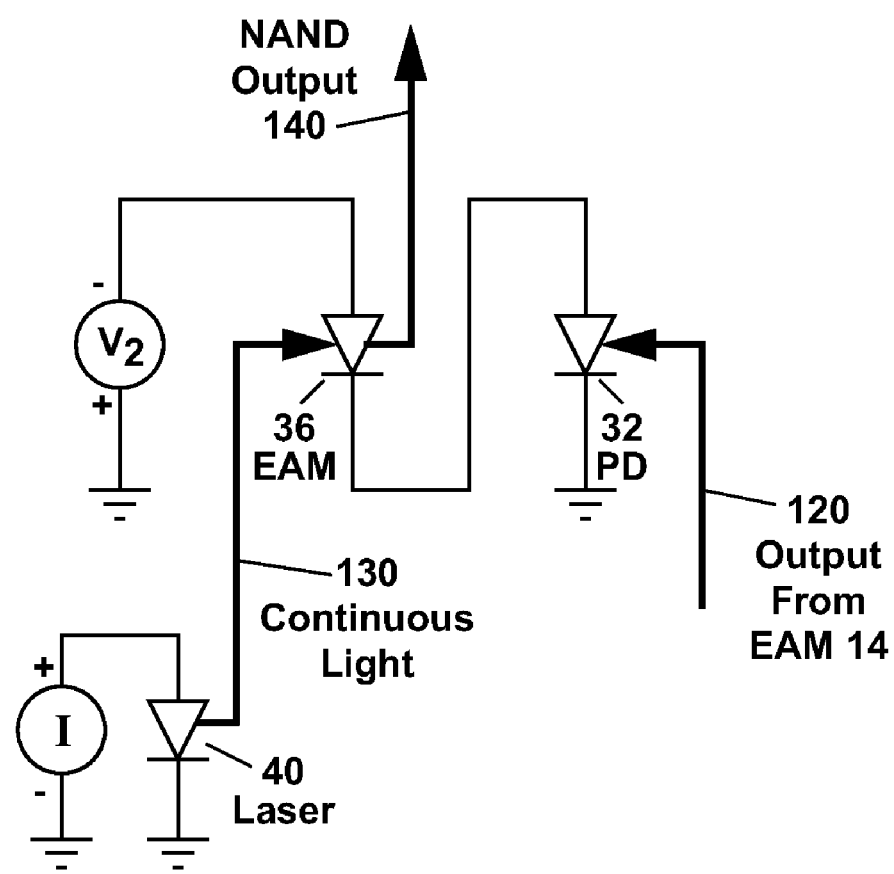
FIG. 2C shows a schematic diagram of an electrical and optical circuit of a series-connected second waveguide photodetector and second electroabsorption modulator from the optical NAND gate of FIG. 1.

FIG. 2C shows a schematic diagram of the electrical and optical circuit of the series-connected modulator 36 and photodetector 32 to illustrate operation of this second pair of optical waveguide devices. The series-connected modulator 36 and photodetector 32 functions as a NOT logic gate (also referred to as a NOT gate, or an optical inverter) using inputs of the continuous light 130 from the laser 40, and the output 120 from the first electroabsorption modulator 14. When the output 120 from the first electroabsorption modulator 14 is in a logical "1" state, light from the output 120 is absorbed within the second waveguide photodetector 32 to generate the photocurrent signal therein; and this photocurrent signal must also flow through the second electroabsorption modulator 36 since the two waveguide devices 32 and 36 are electrically connected in series. As a result of the increased current flow through the modulator 36, the electric field therein must also increase; and this requires the amount of the reverse-bias voltage $V_2$, which is dropped across the modulator 36, to increase. This, in turn, increases the absorption of light in the electroabsorption modulator 36 so that substantially all of the continuous light 130 is absorbed therein. With very little, if any, of the continuous light 130 being transmitted through the second electroabsorption modulator 36, a NAND output 140 from the modulator 36 is in a logical "0" level (i.e. in a logic state which is opposite that of the output 120 from the first electroabsorption modulator 14 which is in a logical "1" state).

When the output 120 from the first electroabsorption modulator 14 is in a logical "0" state, very little, if any, light reaches the second waveguide photodetector 32 so that very little, if any, photocurrent signal is generated therein. In this case, the reverse-bias current flowing through the second electroabsorption modulator 36 must also be of the same magnitude as the photocurrent signal from the photodetector 32; and this requires that the amount of the reverse-bias voltage $V_2$, which is dropped across the electroabsorption modulator 36, to be small so that the absorption of light in the modulator 36 is also small. This small absorption of the modulator 36 allows substantially all of the continuous light 130 to be transmitted through the modulator 36 to provide a logical "1" state for the NAND output 140. Again, the logical state of the NAND output 140 is exactly opposite that of the output 120 from the first electroabsorption modulator 14. Thus, the electrical and optical circuit of FIG. 2C functions as an optical NOT gate.

Figures 3A, 3B:
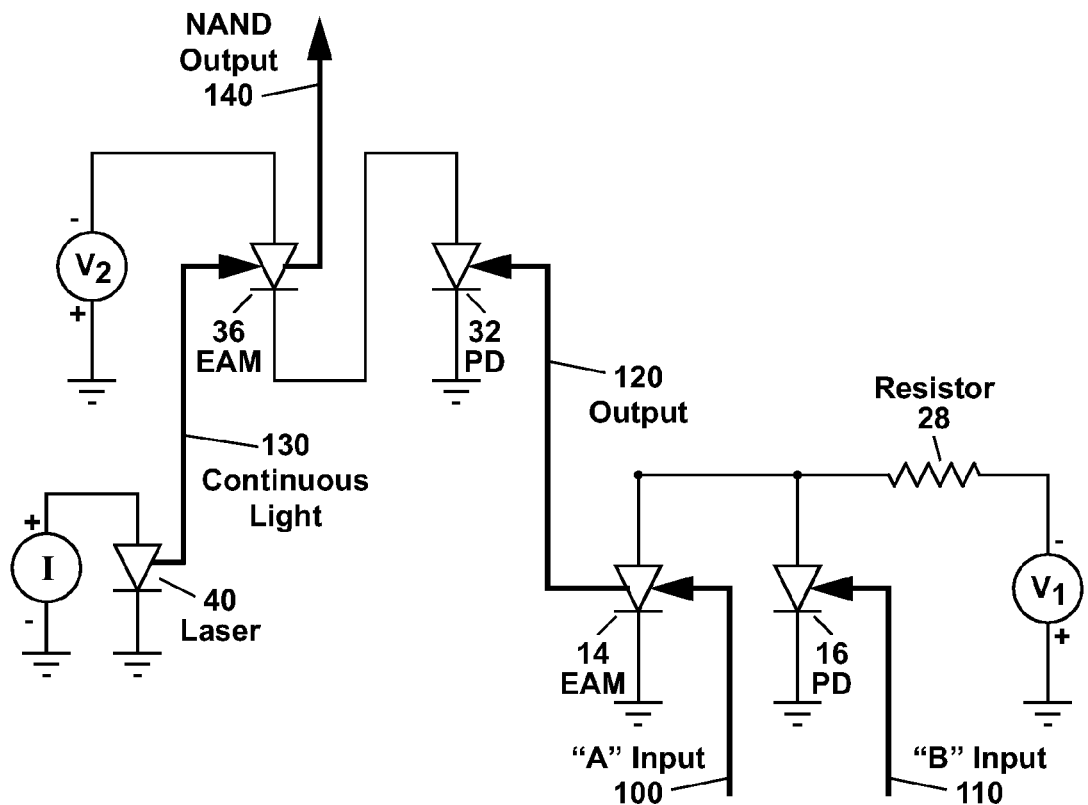
FIG. 3A shows a schematic diagram of the electrical and optical circuit for the entire optical NAND gate of FIG. 1.
FIG. 3B shows a logical truth table for the optical NAND gate of FIG. 1.

The combined electrical and optical circuits of FIGS. 2A and 2C are shown in FIG. 3A. This corresponds to the full operation of the optical NAND gate 10 of FIG. 1. FIG. 3B also shows a logical truth table for the combined electrical and optical circuit of FIG. 3A.

Fabrication of the optical NAND gate 10 of FIG. 1 will now be described with reference to FIGS. 4A-4G which show a series of schematic cross-section views of the device 10 along the section line 1-1 in FIG. 1 during various steps in the fabrication of the optical NAND gate 10, and with reference to FIG. 4H which shows a schematic cross-section view along the section line 2-2 in FIG. 1. Fabrication of the optical NAND gate 10 of FIG. 1 will be described using a quantum-well intermixing process using a plurality of III-V compound semiconductor layers which are epitaxially grown on the substrate 12 which is also preferably a III-V compound semiconductor substrate (e.g. comprising indium phosphide or gallium arsenide). The quantum-well intermixing process allows the fabrication of many different photonic integrated circuit (PIC) elements to be formed on the same substrate 12 in a manner similar to that of semiconductor integrated circuit (IC) fabrication, while allowing the various elements, which can include passive optical waveguides, waveguide photodetectors, waveguide electroabsorption modulators, lasers, and semiconductor optical amplifiers, to be individually optimized.

Those skilled in the art will understand that the optical NAND gate 10 of the present invention can also be fabricated using other types of III-V compound semiconductor fabrication methods which are well-known in the art. These other types of III-V compound semiconductor fabrication methods include butt-joint regrowth, selective area growth, and the use of offset quantum wells and are detailed in the following articles which are incorporated herein by reference: E. Skogen et al., "Monolithically Integrated Active Components: A Quantum-Well Intermixing Approach," *IEEE Journal of Selected Topics in Quantum Electronics*, vol. 11, pp. 343-355, March/April 2005; J. W. Raring et al., "40-Gb/s Widely Tunable Transceivers," *IEEE Journal of Selected Topics in Quantum Electronics*, vol. 13, pp. 3-14, January/February 2007.

Figure 4A:
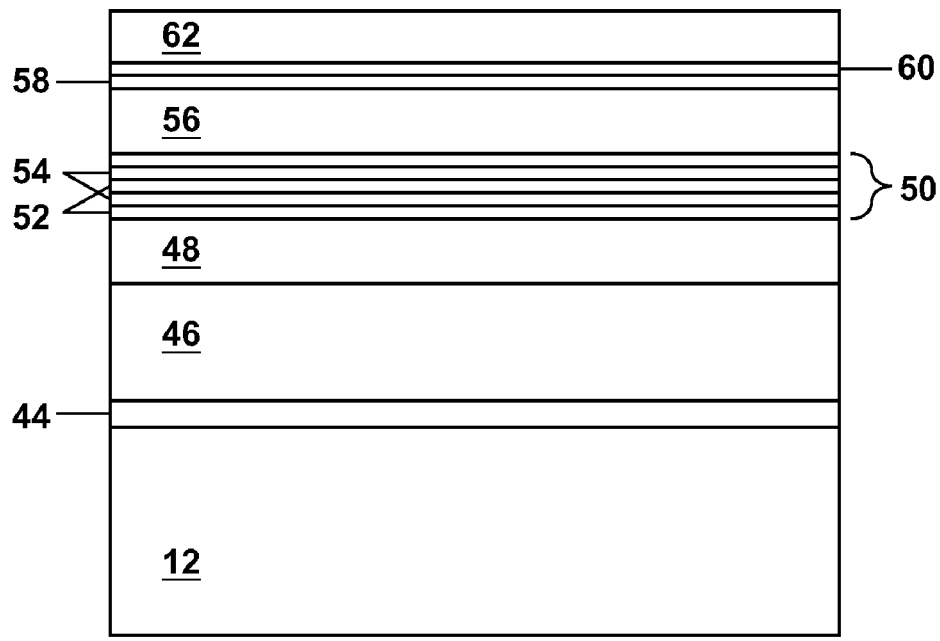
FIGS. 4A-4H show schematic cross-section views along the section lines 1-1 and 2-2 in FIG. 1 to illustrate a series of process steps in the fabrication of the optical NAND gate of FIG. 1.
Figure 4B:
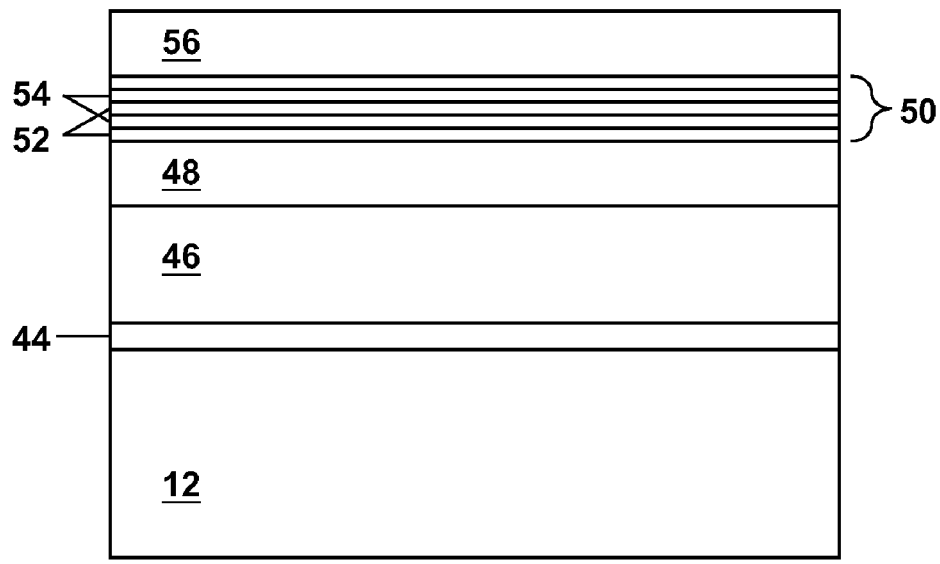

FIG. 4A shows a schematic cross-section view of the plurality of III-V compound semiconductor layers which can be initially epitaxially grown on the substrate 12 in preparation for fabricating the optical NAND gate 10 of the present invention. The III-V compound semiconductor layers can comprise, for example, indium phosphide (InP), indium gallium arsenide phosphide (InGaAsP), indium gallium arsenide (InGaAs), indium aluminum gallium arsenide (InAlGaAs) layers and combinations thereof when the substrate 12 comprises InP. Alternately, the III-V compound semiconductor layers can comprise gallium arsenide (GaAs), aluminum gallium arsenide (AlGaAs), InGaAsP, InGaAs, and combinations thereof when the substrate 12 comprises GaAs. The following discussion will describe fabrication of the optical NAND gate 10 using an InP substrate 12 with InP, InGaAsP and InGaAs layers thereon, but those skilled in the art will understand that the various process steps described hereinafter can be applied with minor modifications to an optical NAND gate 10 formed on a GaAs substrate 12 with a combination of GaAs, AlGaAs, InGaAsP, and InGaAs layers thereon. Those skilled in the art will also understand that other III-V compound semiconductor materials can be used for the substrate 12 and layers epitaxially grown thereon.

In FIG. 4A, the substrate 12 can comprise a semi-insulating Fe-doped InP substrate 12. A plurality of III-V compound semiconductor layers are epitaxially grown on the Fe-doped InP substrate 12 by metal-organic chemical vapor deposition (MOCVD). These III-V compound semiconductor layers are in order of epitaxial growth: an InP buffer layer (not shown), an n-type InGaAs lower contact layer 44; a lower cladding layer 46 of n-type-doped InP which can be 1-2 μm thick; a lower waveguide layer 48 of InGaAsP which is undoped (i.e. not intentionally doped) and about 0.11 μm thick with a composition selected to provide an energy bandgap wavelength $\lambda_g$=1.3 μm; an undoped MQW region 50 which is about 0.11 μm thick and comprises a plurality of alternating quantum well (QW) layers 52 and barrier layers 54 of InGaAsP, with the quantum well layers 52 being about 6.5 nanometers (nm) thick and having an energy bandgap wavelength $\lambda_g$ of, for example, 1.55 μm as measured by photoluminescence, and with the barrier layers 54 being about 8 nm thick and having an energy bandgap wavelength $\lambda_g$=1.3 μm; a upper waveguide layer 56 of undoped InGaAsP about 0.11 μm thick with $\lambda_g$=1.3 μm; an undoped InP etch stop layer 58 about 15 nm thick; an undoped InGaAsP etch stop layer 60 about 20 nm thick with $\lambda_g$=1.3 μm; and an undoped InP implant buffer layer 62 about 0.45 μm thick. As an example, the QW layers 52 can have the semiconductor alloy composition $In_xGa_{1-x}As_yP_{1-y}$ with x=0.735 and y=0.840 to provide the energy bandgap wavelength $\lambda_g$=1.55 μm; and the barrier layers 54 can be formed of $In_xGa_{1-x}As_yP_{1-y}$ with x=0.735 and y=0.513. Those skilled in the art will understand that the exact composition of the layers 52 and 54 in the MQW region 50 and the compositions of the other III-V compound semiconductor layers can be adjusted as needed to provide predetermined values for energy bandgaps of these layers, with the energy bandgap wavelength $\lambda_g$ of the QW layers 52 generally being in the range of 0.8-2.0 μm.

An ion implant mask (e.g. comprising silicon nitride about 0.5 μm thick) can then be provided over the substrate 12 and III-V compound semiconductor layers with openings at locations wherein phosphorous ions are to be implanted into the InP implant buffer layer 62 for use in selectively disordering the MQW region 50. The locations where the waveguide photodetectors 16 and 32 and a gain region of the laser 40 are to be formed will generally not have a disordered MQW region 50 since the MQW region 50 is epitaxially grown to optimize the performance of the photodetectors 16 and 32 and the gain region of the laser 40. The phosphorous ions can be implanted into the InP implant buffer layer 62 at an ion energy of about 100 keV and a dose of about $5 \times 10^{14}$ cm$^{-2}$ with the substrate 12 being at a temperature of about 200° C. The implanted phosphorous ions produce point defects in the InP implant buffer layer 62.

A rapid thermal annealing step can then be used to drive the point defects down into the MQW region 50 to intermix the QW layers 52 and the barrier layers 54 at the interfaces therebetween. This intermixing produces a blue-shift in energy bandgap wavelength in the MQW region 50. The rapid thermal annealing step can be performed at a temperature in the range of 630-700° C. and can be timed for a time interval from about one-half minute up to a few tens of minutes to provide a predetermined energy bandgap wavelength for the MQW region 50 which will depend upon the exact elements of the optical NAND gate 10 being formed. To form the electroabsorption modulators 14 and 36, a first rapid thermal annealing step can be used to provide a few tens of nanometer blue-shift in the energy bandgap wavelength of the MQW region 50 (e.g. to $\lambda_g$ ~1.50 μm) to reduce an absorption loss therein in the absence of any reverse-bias voltage. This same blue-shift is provided for the MQW region 50 for the passive waveguides 18 and for distributed Bragg reflector (DBR) mirror regions which are used to form an optical cavity for the DBR laser 40 and for the gain region and an optional phase control region located within the optical cavity of the DBR laser 40. An additional blue-shift will be provided in a subsequent thermal annealing step for the passive waveguides 18 and the DBR mirror regions to further increase the blue-shift therein (e.g. to $\lambda_g$ ~1.43 μm) and thereby further reduce the absorption for these elements of the optical NAND gate 10. The blue-shift in the energy bandgap wavelength of the MQW region 50 can be determined using a laser-excited room-temperature photoluminescence spectroscopy measurement.

After the first rapid thermal annealing step, the InP implant buffer layer 62 can be removed above the electroabsorption modulators 14 and 36 while leaving the layer 62 in place over the passive waveguides 18 and DBR mirror regions. This can be done using a wet etching step to etch away the layer 62, with the wet etching being terminated upon reaching the InGaAsP etch stop layer 60. Removal of the InP implant buffer layer 62 above the electroabsorption modulators 14 and 36 prevents any further blue-shift in the MQW region 50 at these locations since it removes the source of point defects necessary for quantum-well intermixing.

A second rapid thermal annealing step can then be performed at about the same temperature for up to a few minutes (e.g. 2-3 minutes) to provide further intermixing of the QW and barrier layers 52 and 54 to produce an additional few tens of nanometers blue-shift the energy bandgap of the MQW region 50 in the remaining regions where the InP implant buffer layer 62 is still present. This additional blue-shift in the energy bandgap of the MQW region 50 further reduces the absorption loss in the passive waveguides 18 and the DBR mirror regions of the optical NAND gate 10.

After the second rapid thermal annealing step is performed, the remaining InP implant buffer layer 62 and the InGaAsP etch stop layer 60 can be completely removed from the substrate 12 by wet etching. This is schematically illustrated in the cross-section view of FIG. 4B. Another etching step can then be used to etch a corrugated grating structure down partway into the upper waveguide layer 56 to form a DBR mirror at each end of the DBR laser 40. A rear DBR mirror for the DBR laser 40 can be formed with a length of, for example, 200 μm, and a front DBR mirror in the DBR laser 40 can have a length of, for example, 10-50 μm long. The gain region of the DBR laser 40 can have a length of, for example, 200-500 μm. When a separately-contacted phase control section is to be provided in the DBR laser 40 to provide for tuning of the wavelength of the continuous light 130, the phase control section can have a length of, for example, 75 μm and can be connected through wiring 22 on the substrate 12 to a separate bond pad 30 (not shown in FIG. 1).

Figure 4C:
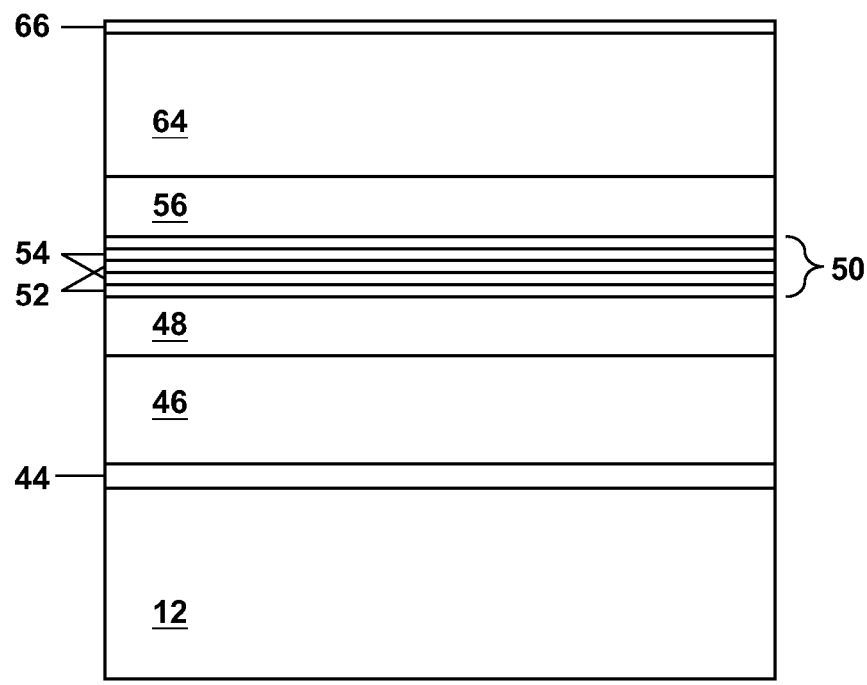

A blanket MOCVD regrowth can then be performed to epitaxially grow an upper cladding layer 64 of p-type-doped InP which can be, for example, 2.35 μm thick followed by a cap layer 66 of p-type-doped InGaAs about 0.2 μm thick. This is shown in FIG. 4C. The p-type-doped InP upper cladding layer 64 in combination with the n-type-doped lower cladding layer 46 form a semiconductor p-i-n junction about the MQW region 50 and waveguide layers 48 and 56 which are undoped (i.e. intrinsic). This semiconductor p-i-n junction is used for electrically-activated elements in the optical NAND gate 10 including the waveguide photodetectors 16 and 32, the electroabsorption modulators 14 and 36 and the gain region of the laser 40 and any semiconductor optical amplifiers (if used).

In other embodiments of the present invention, an offset quantum-well region can be epitaxially grown above the upper waveguide layer 56. This can be useful to form the photodetectors 16 and 32 as uni-traveling carrier photodetectors, and can also be useful to form semiconductor optical amplifiers (SOAs). The use of an offset quantum-well region provides a lower confinement factor than the quantum-well region 50 and thus can increase the saturation power level for the photodetectors 16 and 32 and any SOAs and also allow operation at higher frequencies. Further details of the fabrication of photodetectors and SOAs using offset quantum-well region can be found in an article by J. W. Raring et al., "Design and Demonstration of Novel QW Intermixing Scheme for the Integration of UTC-Type Photodiodes with QW-Based Components," *IEEE Journal of Quantum Electronics*, vol. 42, pp. 171-181, February 2006, which is incorporated herein by reference.

Figure 4D:
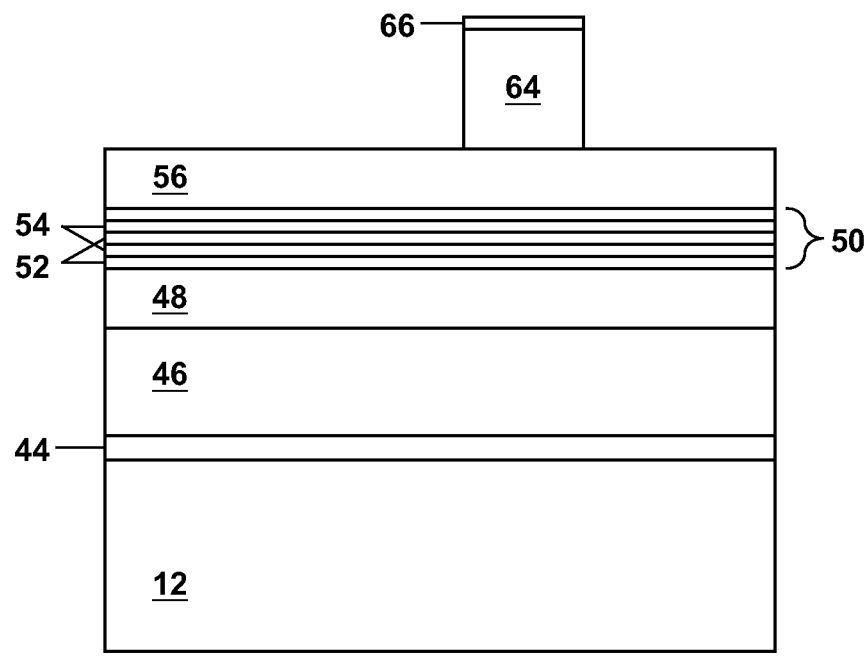

An etch mask (not shown) can be provided over the substrate 12 and photolithographically patterned for use in etching down through the InGaAs cap layer 66 and the InP upper cladding layer 64 as shown in FIG. 4D. This defines an effective waveguide width of the various elements 16, 18, 32, 36 and 40 which can be, for example, up to a few microns or more (e.g. 1-3 µm for the waveguides 18, modulators 32 and 36 and laser 40; and 1-10 µm wide for the photodetectors 16 and 32 and any SOAs). The waveguide photodetectors 16 and 32 can each have a length of, for example, 30-70 µm; and can be straight (e.g. when the photodetectors 16 and 32 have the same width as the passive waveguides 18) or can be tapered at one or both ends thereof (e.g. when the photodetectors 16 and 32 have a width that is larger than the width of the passive waveguides 18 and 20). The electroabsorption modulators 14 and 36 can have a length of, for example, 100-300 µm.

Figure 4E:
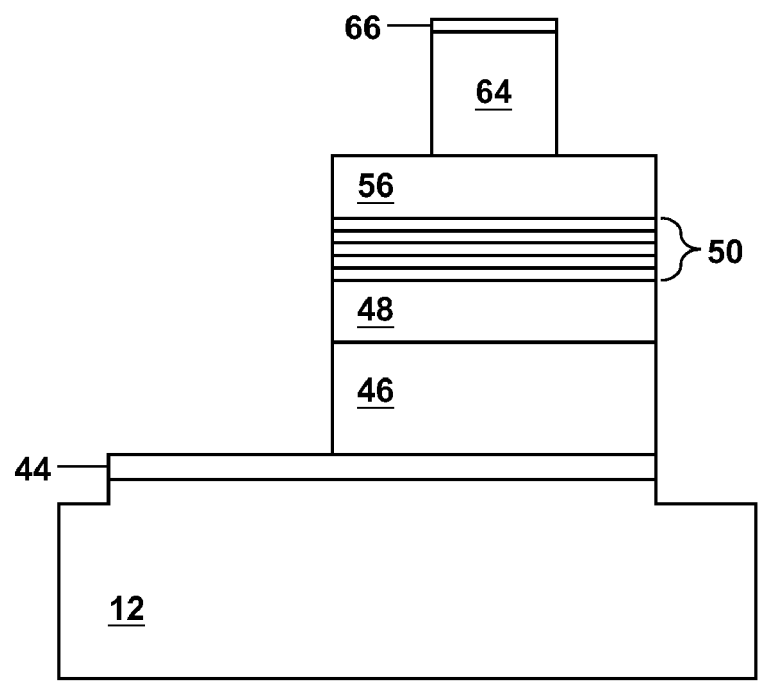

In FIG. 4E, one or more additional etching steps can be used to etch down to the InGaAs lower contact layer 44 and partway into the semi-insulating InP substrate 12.

Figure 4F:
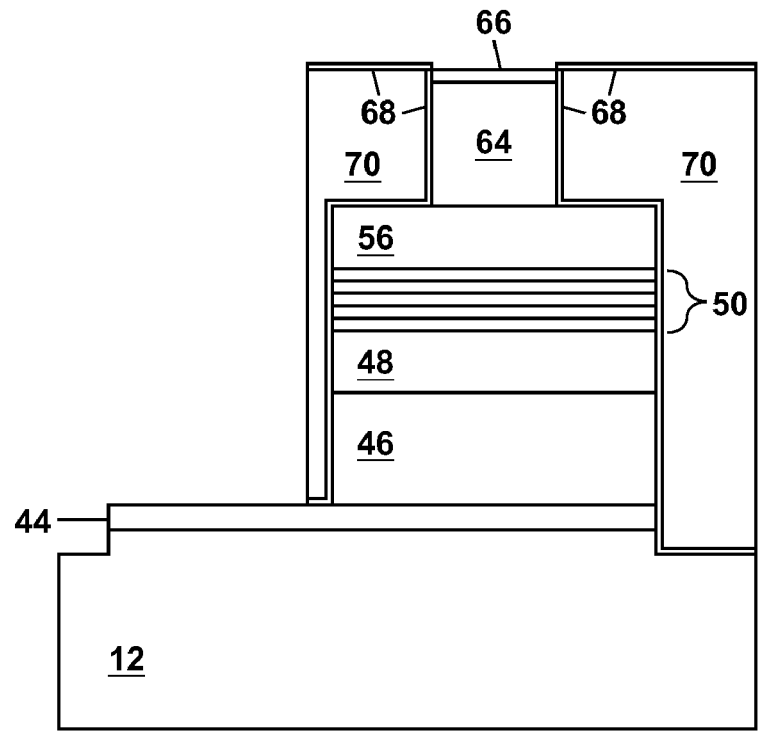

In FIG. 4F, layers of silicon nitride 68 and benzocyclobutene (BCB) 70 can then be deposited over the substrate 12 about the photodetectors 16 and 32, the modulators 14 and 36 and the laser 40, with openings at the locations where the upper and lower electrodes will be formed. The BCB 70 can be tapered outside of the photodetector 16 to allow the resistor 28 to be formed directly over the silicon nitride layer 68 on the InP substrate 12 which is useful for heat sinking of the resistor 28 to the InP substrate 12. The silicon nitride layers 68 can each be about 0.1-0.2 µm thick.

Figure 4G:
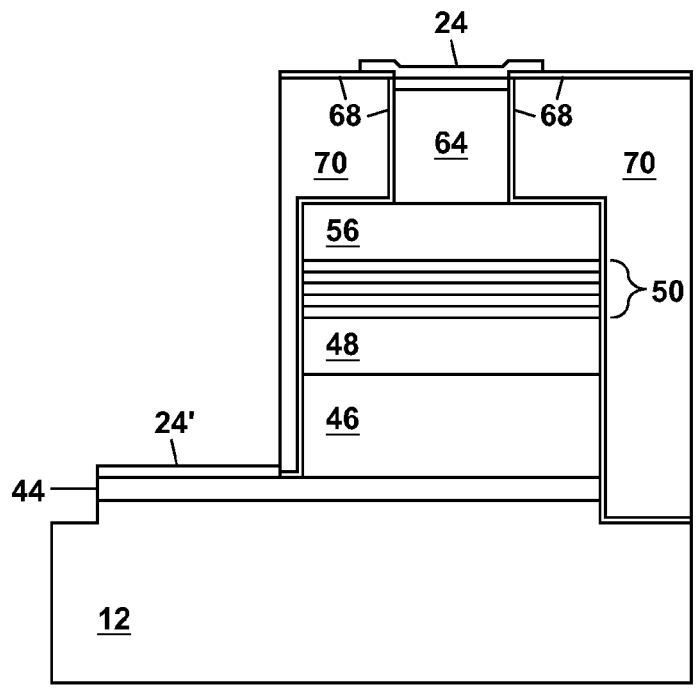
Figure 4H:
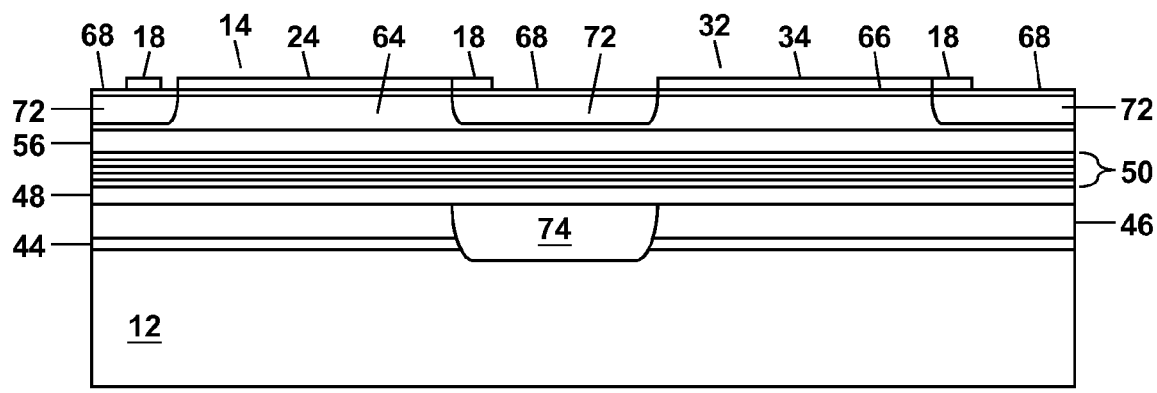

In FIG. 4G, the lower and upper electrodes can be deposited. The lower electrodes 24', 26', 34', 38' and 42' can comprise, for example, a gold/germanium/nickel/gold (Au/Ge/Ni/Au) metallization with an overall thickness of about 0.5 µm; and the upper electrodes 24, 26, 34, 38, 42 and the wiring 22 can be formed from a titanium/platinum/gold (Ti/Pt/Au) metallization with an overall thickness of about 1 µm. The resistor 28 can be deposited as a thin-film metal resistor (e.g. comprising tantalum nitride or nichrome) with a resistance of, for example, 25-50 Ohms.

Adjacent elements of the optical NAND gate 10, which are not optically connected are electrically isolated by etching down partway into the semi-insulating InP substrate 12 as shown in FIG. 4G. However, this does not electrically isolate adjacent elements of the optical NAND gate 10 which must be optically connected via one of the passive waveguides 18. For these elements including the first electroabsorption modulator 14 which is optically connected to the second waveguide photodetector 32, and the laser 40 which is optically connected to the second electroabsorption modulator 36, the III-V compound semiconductor layers in a passive waveguide region between these optically-connected elements can be ion implanted. Hydrogen ions can be implanted at an energy of about 200 keV to electrically isolate regions 72 of the p-type-doped III-V compound semiconductor layers; and helium ions can be implanted at an energy of about 2 MeV to electrically isolate regions 74 of the n-type-doped III-V compound semiconductor layers, with the helium-implanted regions 74 extending down partway into the InP substrate 12. The hydrogen-implanted regions 72 can also extend around the electrically-active elements 14, 16, 32, 36 and 40 as shown in FIG. 4H to improve the electrical characteristics of these elements. The helium-implanted regions 74 are located where the n-type-doped III-V compound semiconductor layers extend between the first electroabsorption modulator 14 and the second waveguide photodetector 32 as shown in FIG. 4H, and also between the laser 40 and the second electroabsorption modulator 36 in the completed device 10. The ion implantation steps can be performed with suitable masking to protect the electrically-active elements after epitaxial growth of the InP layer 64 and the InGaAs cap layer 66 as previously described with reference to FIG. 4C. FIG. 4H shows a schematic cross-section view along the section line 2-2 in FIG. 1 to illustrate the locations of hydrogen-implanted regions 72 and helium-implanted regions 74 in the completed device 10.

Figure 5:
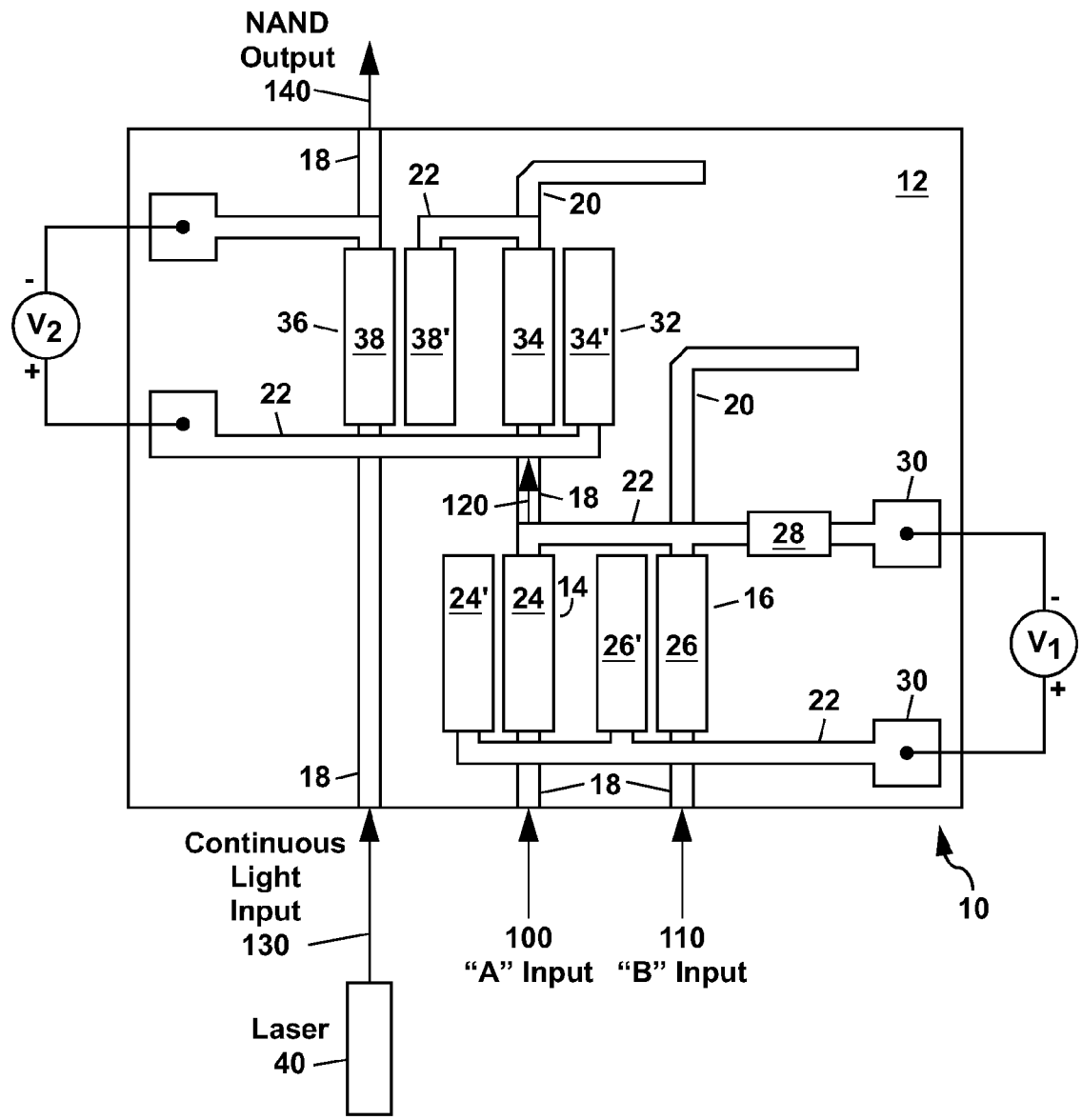
FIG. 5 shows a schematic plan view of a second example of the optical NAND gate of the present invention with the continuous light input being provided by an external laser.

FIG. 5 shows a schematic plan view of a second example of the optical NAND gate 10 of the present invention. This second example of the present invention can be formed in a manner similar to that previously described for the first example of the optical NAND gate 10 with reference to FIGS. 4A-4H except that there is no laser 40 on the substrate 12. The laser 40 can be located off the substrate 12 as shown in FIG. 5 with the continuous light 130 being coupled from the laser 40 into a passive waveguide 18 on the substrate 12 using free-space or optical fiber coupling. This second example of the optical NAND gate 10 of the present invention operates in the same way as the first example which has been described previously.

Figure 6:
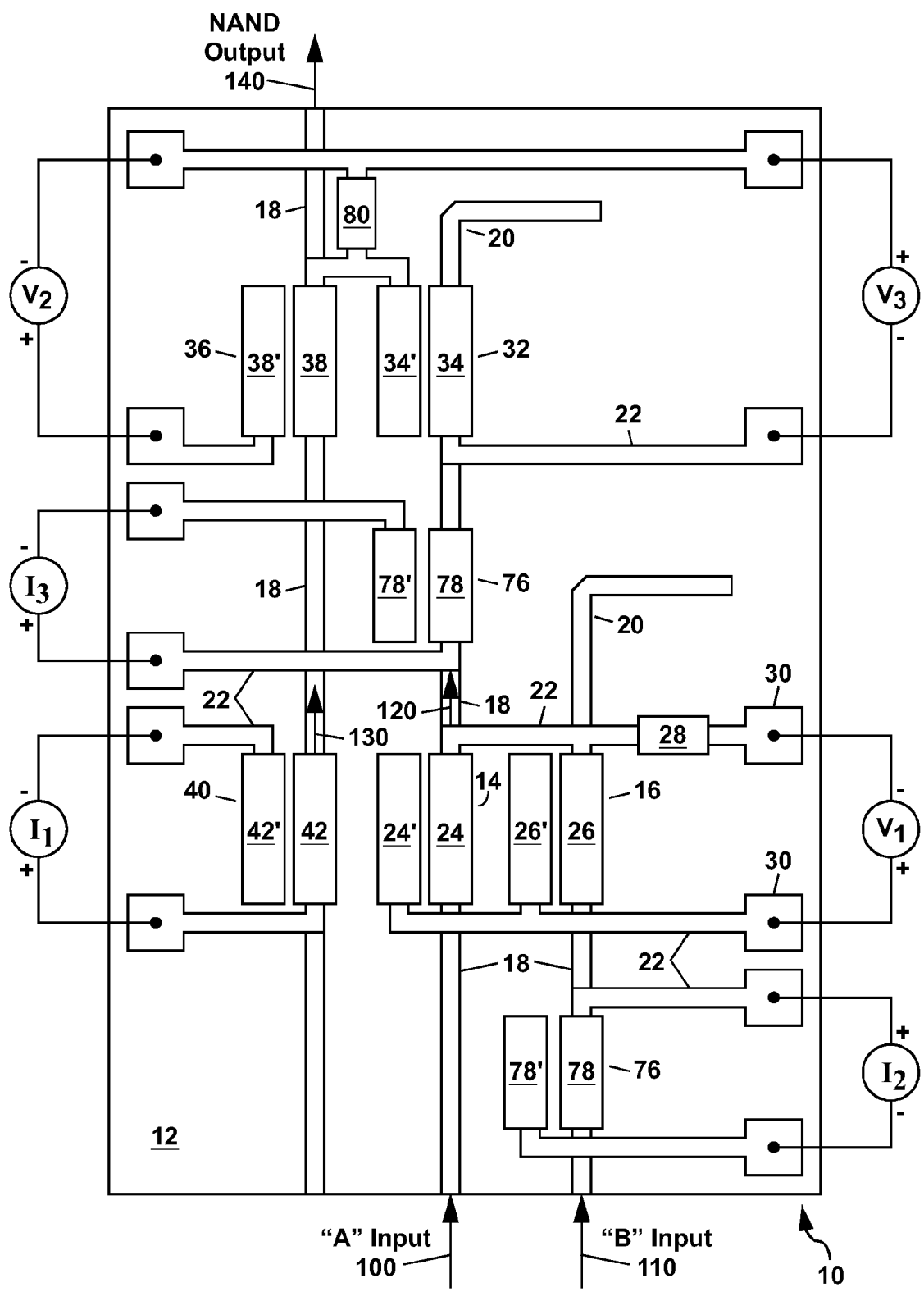
FIG. 6 shows a schematic plan view of a third example of the optical NAND gate of the present invention.

FIG. 6 shows a schematic plan view of a third example of the optical NAND gate 10 of the present invention. In this example of the present invention, the first pair of optical waveguide devices (i.e. the waveguide photodetector 16 and the first electroabsorption modulator 14) are electrically connected together in parallel to form the electrical and optical circuit which has been previously described with reference to FIG. 2A.

A semiconductor optical amplifier (SOA) 76 can be optionally provided on the substrate 12 to amplify the "B" input 110 prior to detection of the "B" input 110 with the first waveguide photodetector 16 as shown in FIG. 6. This is useful to provide an increased optical power (e.g. up to a few tens of milliWatts) for the amplified "B" input 110, which will provide a larger photocurrent signal from the first waveguide photodetector 16 and thereby provide a larger on/off contrast in the light output 120 from the first electroabsorption modulator 14.

Another SOA 76 can be optionally provided to similarly amplify the output 120 from the first electroabsorption modulator 14 as shown in FIG. 6 to allow the generation of a larger photocurrent signal from the second waveguide photodetector 32 and thereby provide a larger on/off contrast ratio in the NAND output 140 from the second electroabsorption modulator 36. This is also useful to reduce the amount of optical power needed for the continuous light 130 from the laser 40. If needed, another SOA 76 can be located between the laser 40 and the second electroabsorption modulator 36 to amplify the continuous light 130 which is input to the modulator 36 (not shown in FIG. 6).

Each SOA 76 can be formed using a gain region similar to the gain region in the laser 40 with an upper electrode 78 and a lower electrode 78'. The gain region for each SOA 76 can have a length of, for example, 100-500 μm, and a width of, for example, 1-10 μm. Alternatively, each SOA 76 can be formed as flared SOA 76 with a width that increases along the length of the SOA 76, or with an offset multi-quantum-well (MQW) gain region. The use of a flared SOA 76 or an SOA 76 having an offset MQW gain region is useful to provide a higher saturation power level for the SOA 76.

In the example of FIG. 6, the laser 40 can be driven by a first current source $I_1$; and the SOAs 76 can be driven by additional current sources $I_2$ and $I_3$ as shown in FIG. 6. Each current source forward biases the gain region to generate optical gain therein.

Figure 7:
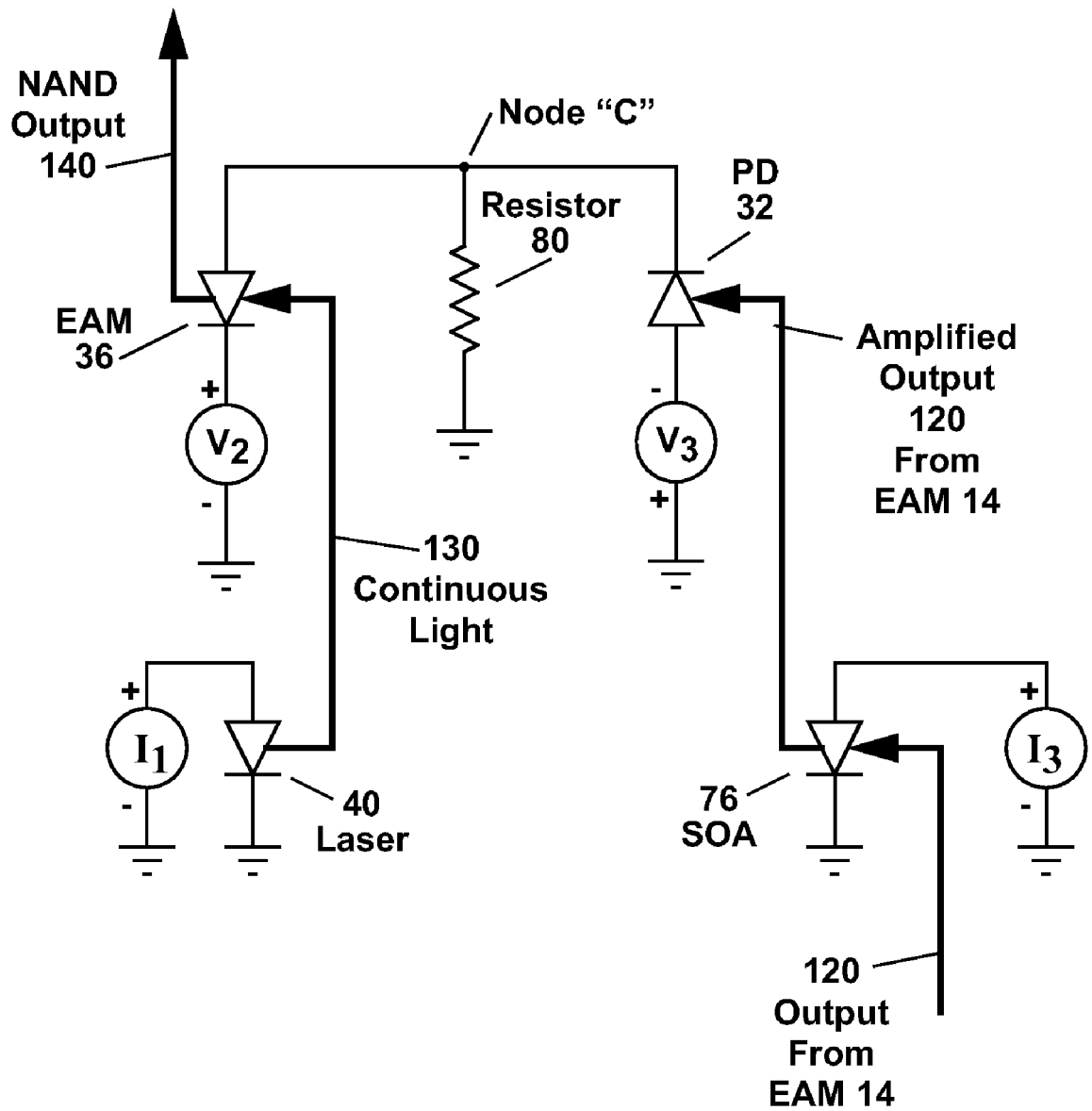
FIG. 7 shows a schematic diagram of the electrical and optical circuit for a series-connected second waveguide photodetector and second electroabsorption modulator in the optical NAND gate of FIG. 6.

In the example of FIG. 6, a different electrical and optical circuit from that of FIG. 2C is provided for the second pair of the optical waveguide devices comprising the second waveguide photodetector 32 and the second electroabsorption modulator 36. This electrical and optical circuit configuration, which also functions as an optical NOT gate, is schematically illustrated in FIG. 7 and uses separate reverse-bias voltages $V_2$ and $V_3$ for the second electroabsorption modulator 36 and for the second waveguide photodetector 32, respectively. The use of two separate reverse-bias voltages $V_2$ and $V_3$ allows a resistor 80 (e.g. a 20-50 Ohm resistor) to be connected between the photodetector 32 and the modulator 36 to ground. This allows a higher reverse-bias voltage change to be produced on the modulator 36, thereby reducing the optical power required for the continuous light 130 from the laser 40, and also providing a higher operating speed for the optical NAND gate 10.

In the absence of any light output 120 incident on the second waveguide photodetector 32, no photocurrent signal will be generated so that node "C" where the photodetector 32, modulator 36 and the resistor 80 are all connected together will be at about ground electrical potential. This drops the entire reverse-bias voltage $V_2$ (e.g. −1 volt) across the modulator 36. Since $V_2$ is relatively small, a relatively small absorption will be produced within the modulator 36 so that substantially all of the continuous light 130 will be transmitted through the modulator 36 to provide a high light level for the NAND output 140 corresponding to a logical "1" state.

When the light output 120 is in a logical "1" state, the light output 120 is amplified by the SOA 76 to provide a relatively high optical power which can be, for example, up to a few tens of milliWatts (e.g. 40 mW). This relatively high optical power of the amplified light output 120 will generate a relatively large photocurrent signal in the photodetector 32, with the photocurrent signal flowing through resistor 80. The reverse-bias voltage $V_3$ (e.g. −5 volts) is also much larger than $V_2$ so that the photocurrent signal generated by the photodetector 32 will produce a large change in the electrical potential at node "C" which will add to and substantially increase the amount of reverse-bias voltage which is dropped across the modulator 36. This will greatly increase the absorption of the continuous light 130 within the modulator 36 so that very little, if any, of the continuous light 130 will transmitted through the modulator 36 to form the NAND output 140 which will then be in a logical "0" state (i.e. in a logic state opposite that of the light output 120 from the first electroabsorption modulator 14). Thus, the electrical and optical circuit of FIG. 7 also acts as an optical NOT gate providing a logic state for the NAND output 140 which is exactly opposite of the logic state of the AND output 120.

Figure 8:
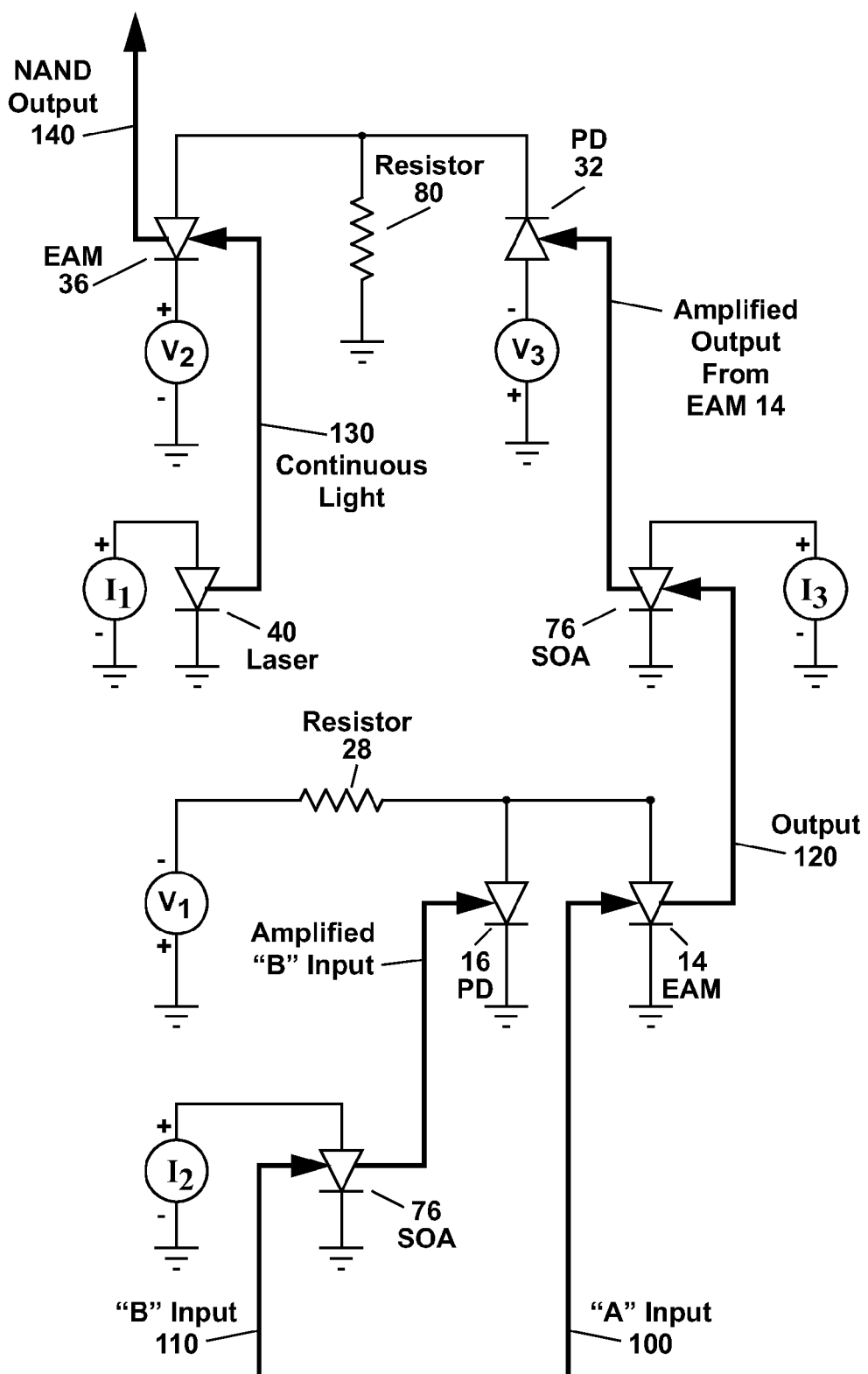
FIG. 8 shows a schematic diagram of the electrical and optical circuit for the entire optical NAND gate of FIG. 6.

FIG. 8 shows the complete schematic diagram of the electrical and optical circuit for the third example of the optical NAND gate 10 of the present invention. This example of the optical NAND gate 10 has the same logical truth table as shown in FIG. 3B, and can be fabricated using the process steps previously described with reference to FIGS. 4A-4H.

Those skilled in the art will understand that the optical NAND gate 10 of the present invention as a building block to form other types of optical logic gates, or to form an optical processor or optical computer. A plurality of NAND gates 10 can be formed on a common substrate 12 and optically connected with passive waveguides 18 to form the other optical logic gates, or to form the optical processor or optical computer in a way analogous to the interconnection of a plurality of transistors to form an integrated circuit. Thus, to form an optical signal processor or optical computer, the NAND outputs 140 from a plurality of devices 10 would be used to provide the "A" and "B" inputs for other devices 10 with the exact number and optical interconnection of the various optical NAND gates 10 depending upon the functionality of the optical signal processor or optical computer.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An optical NAND gate which receives a pair of digital optical inputs each with a logic state and generates therefrom a digital optical output which is a NAND representation of the logic states of the pair of digital optical inputs, the optical NAND gate comprising:

a substrate;

an optical AND gate formed on the substrate and comprising a first electroabsorption modulator and a first waveguide photodetector, with the first electroabsorption modulator receiving a first digital optical input of the pair of digital optical inputs, and with the first waveguide photodetector receiving a second digital optical input of the pair of digital optical inputs and generating therefrom a photocurrent signal, and with the photocurrent signal being connected to modulate an absorption of the first electroabsorption modulator through which the first digital optical input is transmitted and thereby convert the pair of digital optical inputs into a logical AND function output of the first electroabsorption modulator; and an optical NOT gate formed on the substrate and comprising a second electroabsorption modulator and a second waveguide photodetector, with the with the second waveguide photodetector receiving the logical AND function output from the first electroabsorption modulator and generating therefrom another photocurrent signal which is electrically connected to modulate the absorption of the second electroabsorption modulator which receives an input of continuous light, thereby converting the continuous light input into the digital optical output of the optical NAND gate.

2. The apparatus of claim 1 wherein the first electroabsorption modulator and the first waveguide photodetector are electrically connected together in parallel and are electrically connected through a resistor to a bias voltage.

3. The apparatus of claim 1 wherein the second electroabsorption modulator and the second waveguide photodetector are electrically connected in series.

4. The apparatus of claim 1 wherein the input of the continuous light is provided by a laser located on the substrate.

5. The apparatus of claim 4 wherein the laser comprises a distributed-Bragg reflector (DBR) laser.

6. The apparatus of claim 1 further comprising a plurality of optical waveguides on the substrate to guide the first digital optical input to the first electroabsorption modulator, to guide the second digital optical input to the first waveguide photodetector, to guide the continuous light input to the second electroabsorption modulator, to guide the logical AND function output to the second waveguide photodetector, and to guide the digital optical output from the second electroabsorption modulator.

7. The apparatus of claim 1 wherein the substrate comprises a III-V compound semiconductor substrate, and each electroabsorption modulator and each waveguide photodetector comprises a plurality of III-V compound semiconductor layers which are epitaxially grown on the III-V compound semiconductor substrate.

8. The apparatus of claim 7 wherein the III-V compound semiconductor substrate comprises indium phosphide (InP), and the plurality of III-V compound semiconductor layers are selected from the group consisting of indium gallium arsenide phosphide (InGaAsP) layers, indium gallium arsenide (InGaAs) layers, indium aluminum gallium arsenide (InAlGaAs) layers, and combinations thereof.

9. The apparatus of claim 7 wherein the III-V compound semiconductor substrate comprises gallium arsenide (GaAs), and the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

10. The apparatus of claim 1 wherein the first digital optical input and the second digital optical input have a wavelength in the range of 0.8-2.0 microns.

11. An optical NAND gate which receives a first digital optical input and a second digital optical input and generates therefrom a NAND function digital optical output, comprising:
a III-V compound semiconductor substrate having a plurality of III-V compound semiconductor layers epitaxially grown thereon;
a first electroabsorption modulator formed from the plurality of III-V compound semiconductor layers, with the first electroabsorption modulator receiving the first digital optical input;
a first waveguide photodetector formed from the plurality of III-V compound semiconductor layers to receive the second digital optical input and to generate therefrom a first photocurrent signal which changes an absorption of light in the first electroabsorption modulator and thereby converts the first digital optical input into an output of the first electroabsorption modulator;
a second waveguide photodetector formed from the plurality of ITT-V compound semiconductor layers to receive the output from the first electroabsorption modulator and to generate therefrom a second photocurrent signal;
a laser formed from the plurality of III-V compound semiconductor layers to provide a source of continuous light; and
a second electroabsorption modulator formed from the plurality of III-V compound semiconductor layers to receive the continuous light from the laser and to convert the continuous light into the NAND function digital optical output in response to the second photocurrent signal which is electrically connected to vary the absorption of the continuous light being transmitted through the second electroabsorption modulator.

12. The apparatus of claim 11 wherein the III-V compound semiconductor substrate comprises indium phosphide (InP), and the plurality of III-V compound semiconductor layers are selected from the group consisting of indium gallium arsenide phosphide (InGaAsP) layers, indium gallium arsenide (InGaAs) layers, indium aluminum gallium arsenide (InAlGaAs) layers, and combinations thereof.

13. The apparatus of claim 11 wherein the III-V compound semiconductor substrate comprises gallium arsenide (GaAs), and the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

14. The apparatus of claim 11 wherein the first electroabsorption modulator and the first waveguide photodetector are electrically connected in parallel, and are further connected through a resistor to a bias voltage.

15. The apparatus of claim 14 wherein the second electroabsorption modulator and the second waveguide photodetector are electrically connected in series, and are further connected to at least one additional bias voltage.

16. The apparatus of claim 11 wherein the laser comprises a distributed Bragg reflector (DBR) laser.

17. The apparatus of claim 11 wherein a plurality of passive optical waveguides are provided on the substrate and formed from the plurality of III-V compound semiconductor layers to guide the first digital optical input to the first electroabsorption modulator, to guide the second digital optical input to the first waveguide photodetector, to guide the continuous light from the laser to the second electroabsorption modulator, to guide the output from the first electroabsorption modulator to the second waveguide photodetector, and to guide the NAND function digital optical output from the second electroabsorption modulator.

18. The apparatus of claim 11 wherein the first digital optical input and the second digital optical input have a wavelength in the range of 0.8-2.0 microns.

19. A photonic integrated circuit which generates a NAND function digital optical output from a pair of digital optical inputs, comprising:
a first pair of optical waveguide devices formed on a substrate, with the first pair of optical waveguide devices comprising a first electroabsorption modulator which is electrically connected in parallel with a first photodetector, with the first electroabsorption modulator receiving a first digital optical input of the pair of digital optical inputs, and with the first photodetector receiving a second digital optical input of the pair of digital optical inputs to generate therefrom a photocurrent signal which changes a reverse-bias voltage on the first electroabsorption modulator to generate a digital optical output of the first electroabsorption modulator; and
a second pair of optical waveguide devices formed on the substrate, with the second pair of optical waveguide devices comprising a second electroabsorption modulator which is electrically connected in series with a second photodetector, with the second electroabsorption modulator receiving an input of continuous light, and with the second photodetector receiving the digital optical output from the first electroabsorption modulator and generating therefrom another photocurrent signal which changes the reverse-bias voltage on the second electroabsorption modulator to modulate the continuous light being transmitted through the second electroabsorption modulator and thereby generate the NAND function digital optical output.

20. The apparatus of claim 19 wherein the continuous light input is provided by a laser located on the substrate.

* * * * *